United States Patent
Houston et al.

(10) Patent No.: US 8,064,279 B2
(45) Date of Patent: Nov. 22, 2011

(54) STRUCTURE AND METHOD FOR SCREENING SRAMS

(75) Inventors: Theodore W. Houston, Richardson, TX (US); Xiaowei Deng, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 385 days.

(21) Appl. No.: 12/502,879

(22) Filed: Jul. 14, 2009

(65) Prior Publication Data

US 2011/0013470 A1    Jan. 20, 2011

(51) Int. Cl.
*G11C 29/00* (2006.01)
*G11C 8/00* (2006.01)
(52) U.S. Cl. .............. 365/201; 365/154; 365/230.06
(58) Field of Classification Search .............. 365/201, 365/154, 156, 230.06
See application file for complete search history.

(56) References Cited

U.S. PATENT DOCUMENTS

| 6,085,334 | A | * | 7/2000 | Giles et al. | 714/6.32 |
| 6,148,426 | A | * | 11/2000 | Kim et al. | 714/733 |
| 6,343,366 | B1 | * | 1/2002 | Okitaka | 714/733 |
| 2005/0034040 | A1 | * | 2/2005 | Lay | 714/733 |

OTHER PUBLICATIONS

Xiaowei Deng et al., "Structure and Methods for Measuring Margins in an SRAM Bit," Nonprovisional Patent Application Filed Feb. 18, 2009; U.S. Appl. No. 12/388,439.
Xiaowei Deng et al., "Method of Constructing SHMOO Plots for SRAMS," Nonprovisional Patent Application Filed Mar. 10, 2009; U.S. Appl. No. 12/401,181.

* cited by examiner

*Primary Examiner* — Anh Phung
(74) *Attorney, Agent, or Firm* — Rose Alyssa Keagy; Wade J. Brady, III; Frederick J. Telecky, Jr.

(57) ABSTRACT

An integrated circuit containing an SRAM that provides a switch to decouple the SRAM wordline voltage from the SRAM array voltage during screening and that also provides different wordline and array voltages during a portion of the SRAM bit screening test. A method for screening SRAM bits in an SRAM array in which the wordline voltage is different than the array voltage during a portion of the screening test.

20 Claims, 7 Drawing Sheets

STRUCTURE AND METHOD FOR SCREENING SRAMS

CROSS-REFERENCE TO RELATED APPLICATIONS

The following co-pending patent applications are related and hereby incorporated by reference: U.S. patent application Ser. No. 12/388,439 and U.S. patent application Ser. No. 12/401,181. With mention in this section, these patent applications are not admitted to be prior art with respect to the present invention

FIELD OF THE INVENTION

This invention relates to the field of integrated circuits. More particularly, this invention relates to the testing of SRAM memories in integrated circuits.

DETAILED DESCRIPTION

Figure 1:
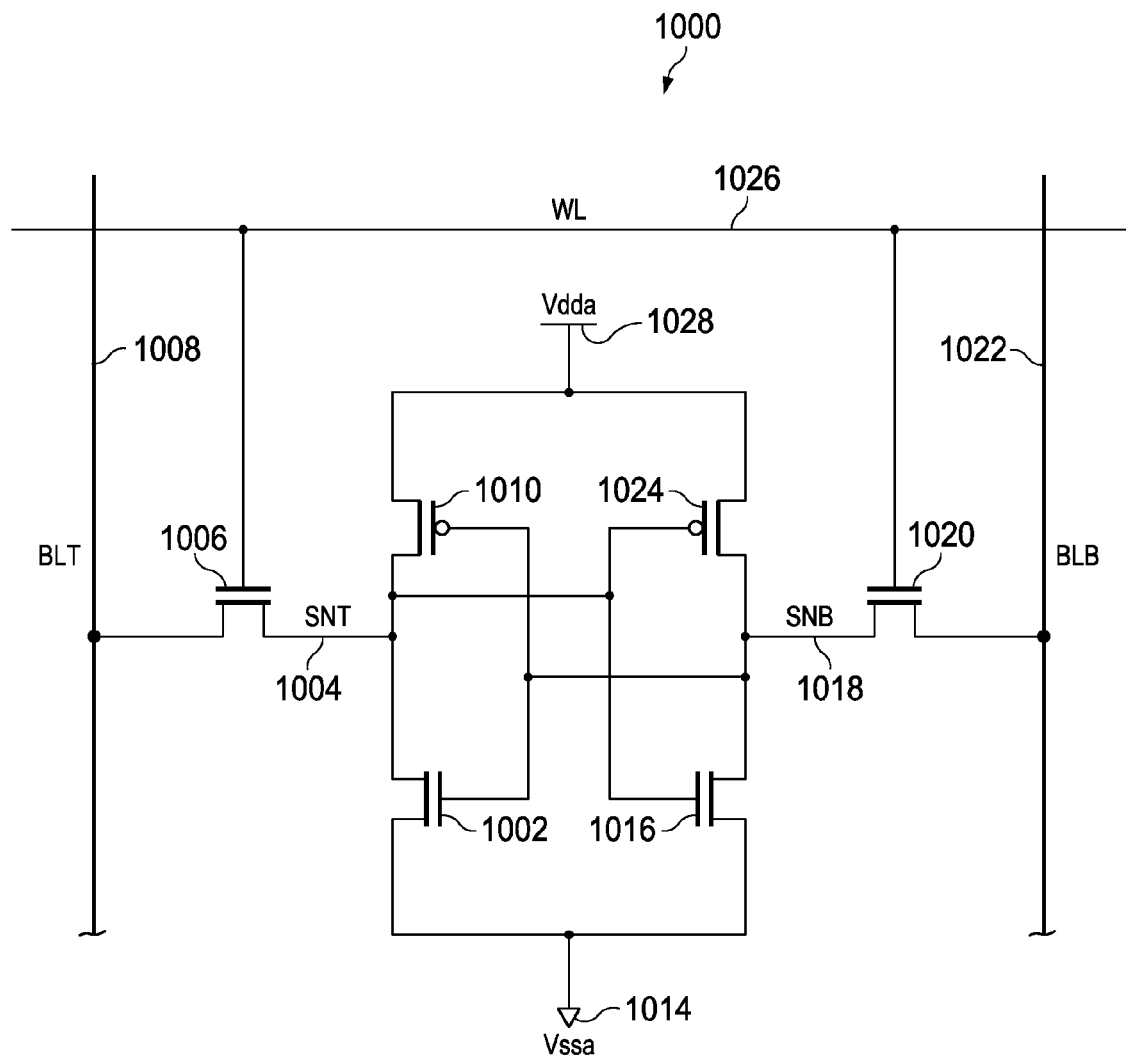
FIG. 1 (Prior art) is an illustration of a 6T SRAM cell.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The worst case operating conditions for discrete (e.g. stand-alone) and embedded (e.g. one of many circuits in an integrated circuit) SRAM SNM (stability) and Vtrip (writeability) are when the SRAM is in a high or low temperature environment, or sometimes at end of life (EOL). Upon completion of the manufacturing process, discrete and embedded SRAMs are screened to find weak SRAM bits that may fail the specification parameters for temperature and voltage, or may fail before the specified time for EOL is reached. Currently, screening is performed at room temperature by biasing the wordline (WL) and the array (Vdda) with the same stress voltage level and determining if a successful write and read operation may be performed. To ensure there are no escapes (e.g. SRAM bits that are not caught at screen but later fail during operation life) the screen applies a bias voltage to the array that may be outside the specified operating range and therefore may fail good parts (lowering manufacturing yield).

By providing a separate voltage supply for WL and Vdda, independent stress voltage levels may be applied to WL and Vdda during screening; allowing the Vdda level to be kept within the specified operating range (while possibly allowing the WL level to be outside the specified operating range) and enabling a more effective screen to be performed. This more effective screen may improve yield by reducing the number of good bits that may be rejected compared to a method which applies the same stress voltage level to WL and Vdda.

FIG. 1 is an illustration of a 6T SRAM bit (1000). The 6T SRAM bit is used for purposes of illustration but it is noted that this invention works equally well with other SRAM bit types. The sources of the PMOS pullup transistors (1010) and (1024) are connected to the array voltage, Vdda (1028). The drain of the left pullup transistor (1010) is connected to the left storage node (1004) that is labeled as storage node true (SNT). The drain of the right pullup transistor (1024) is connected to the right storage node (1018) that is labeled as storage node bar (SNB). The sources of NMOS pulldown transistors (1002) and (1016) are connected to the low voltage array power supply, Vssa (1014), which usually is a voltage close to ground. The drain of the left pulldown transistor (1002) is connected to SNT (1004) and the drain of the right pulldown transistor (1016) is connected to SNB (1018). One side of left NMOS passgate transistor (1006) is connected to SNT (1004), and the other side is connected to the left bit line (1008) that is labeled as bit line true (BLT). One side of the right NMOS passgate transistor (1020) is connected to storage node, SNB (1018) and the other side is connected to the right bit line (1022) that is labeled as bit line bar (BLB). The gates of both passgate transistors (1006) and (1020) are connected to the wordline (1026).

Figure 2:
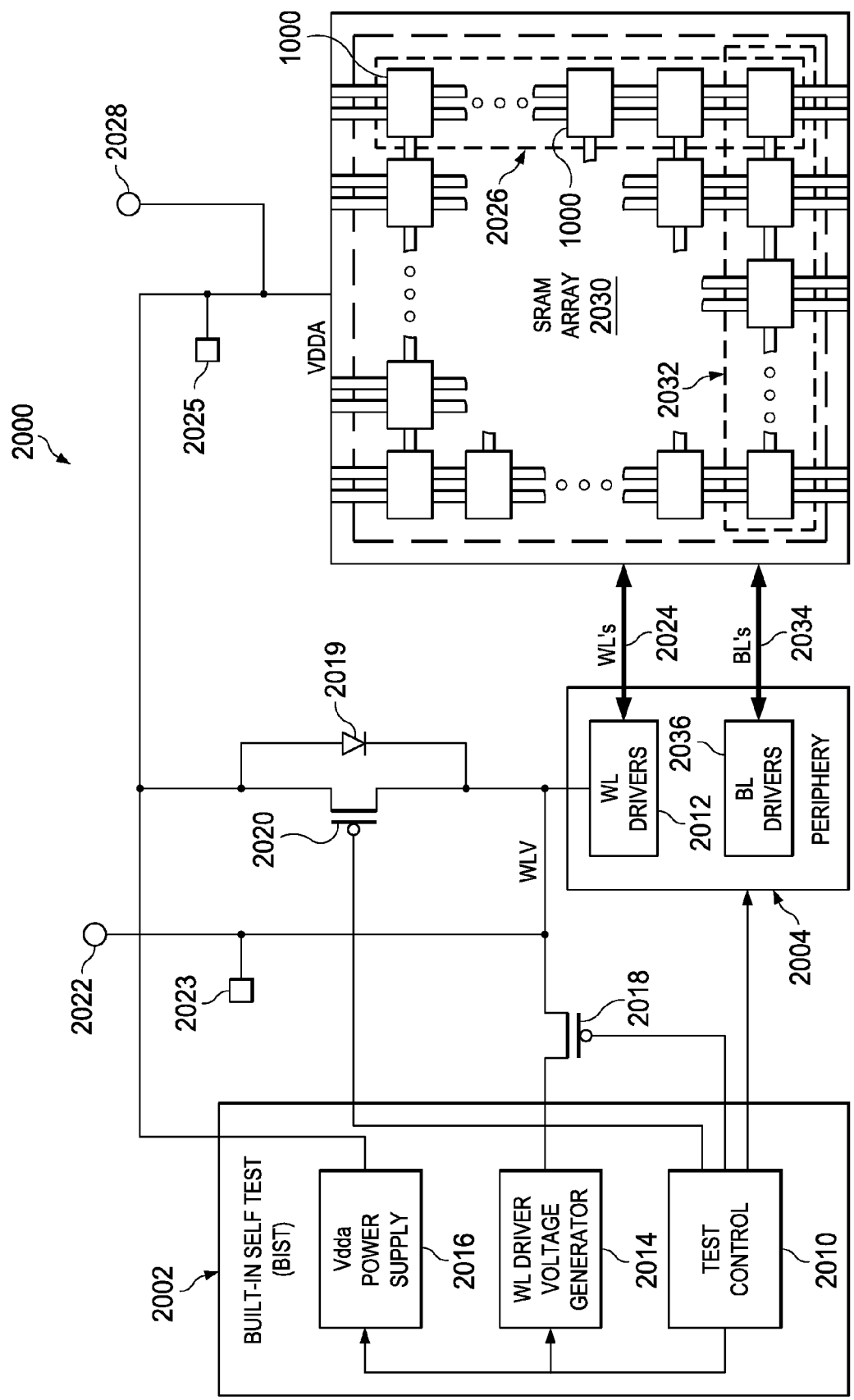
FIG. 2 is an example integrated circuit

FIG. 2 is a block diagram of a SRAM integrated circuit (2000) containing circuitry to implement screening according to embodiments of this invention. The SRAM integrated circuit (2000) contains an SRAM bit array (2030), a periphery circuit block (2004), and a built-in self test circuit block, "BIST", (2002). The SRAM bit array (2030) contains SRAM bits (1000) (that may be similar to the SRAM bit 1000 depicted in FIG. 1) that are arranged in rows (2032) and columns (2026). The periphery circuit block (2004) contains wordline drivers (2012) which are connected to the SRAM rows (2032) with wordlines (2024) and also contains bitline drivers (2036) which are connected to the SRAM columns (2026) with bitlines (2034). The periphery circuit block (2004) also contains other circuitry that is required for the SRAM to function, such as multiplexers (not shown) and sense amplifiers (not shown). The BIST circuit block (2002), contains test control circuitry (2010) which controls the function of the SRAM array (2030) when it has been switched into the screening test mode. It also may contain an array voltage (Vdda) power supply (2016) and a wordline voltage (WLV) generator (2014) unless one or both of these voltages are supplied through external connections such as external pin (2028) for Vdda and external pin (2022) for WLV. These external pins may be used to supply external voltages or may be used to measure internally generated voltages during screening test. When the screening voltages WLV (2014) and Vdda (2016) are generated on chip, microprobe pads, (2023) and (2025), may be provided to directly measure the screening voltages.

During a screening test, a signal which may be applied to an external pin (not shown) switches the integrated circuit (2000) into a screening test mode in which the test control circuit (2010) sends signals to the periphery circuit (2004) to perform the screening test. Optionally the circuit (2000) may be switched into a screening testing mode and many of the signals to perform the test may be generated by an off chip test controller (not shown). During the screening test, test control circuit (2010) turns operation transistor (2020) off to disconnect the wordline drivers (2012) from the Vdda power supply (2016) so WLV and Vdda may be set to different voltages during a portion of the screening test. The wordline driver supplies the wordline voltage to the selected wordline (2024) during screening or during operation. During the screening test, a test transistor (2018) is turned on to connect the WLV generator (2014) with the wordline driver (2012). During operation, test control circuit (2010) may turn test transistor (2018) off and may turn operation transistor (2020) on so that the wordline driver (2012) voltage, WLV, is the same as Vdda. Optionally a fixed delta may be established between the voltage levels of WLV and Vdda during operation. For example, a voltage level changing circuit or device such as the operation diode (2019), shown to be in parallel with operation transistor (2020), may be added to the circuit.

Screening SRAM bits using the same voltage level for WLV and Vdda may cause increased stress on the SRAM bit and may cause more good bits to fail (thus decreasing yield). By providing separate control of Vdda and WLV voltage levels, the screen may be customized to stress the write, read, and stability margins of SRAM bits with voltages similar to operational voltages to identify and fail weak bits without failing as many good bits—as compared to screening tests that utilize equal voltage levels for WLV and Vdda.

The term "safe-write voltage" refers to a WLV and Vdda voltage at which an SRAM bit may be successfully written. In this case WLV and Vdda are usually equal voltages.

The term "safe-read voltage" refers to a WLV and Vdda voltage at which an SRAM bit may be successfully read. In this case WLV and Vdda are usually equal voltages.

Figure 3A:
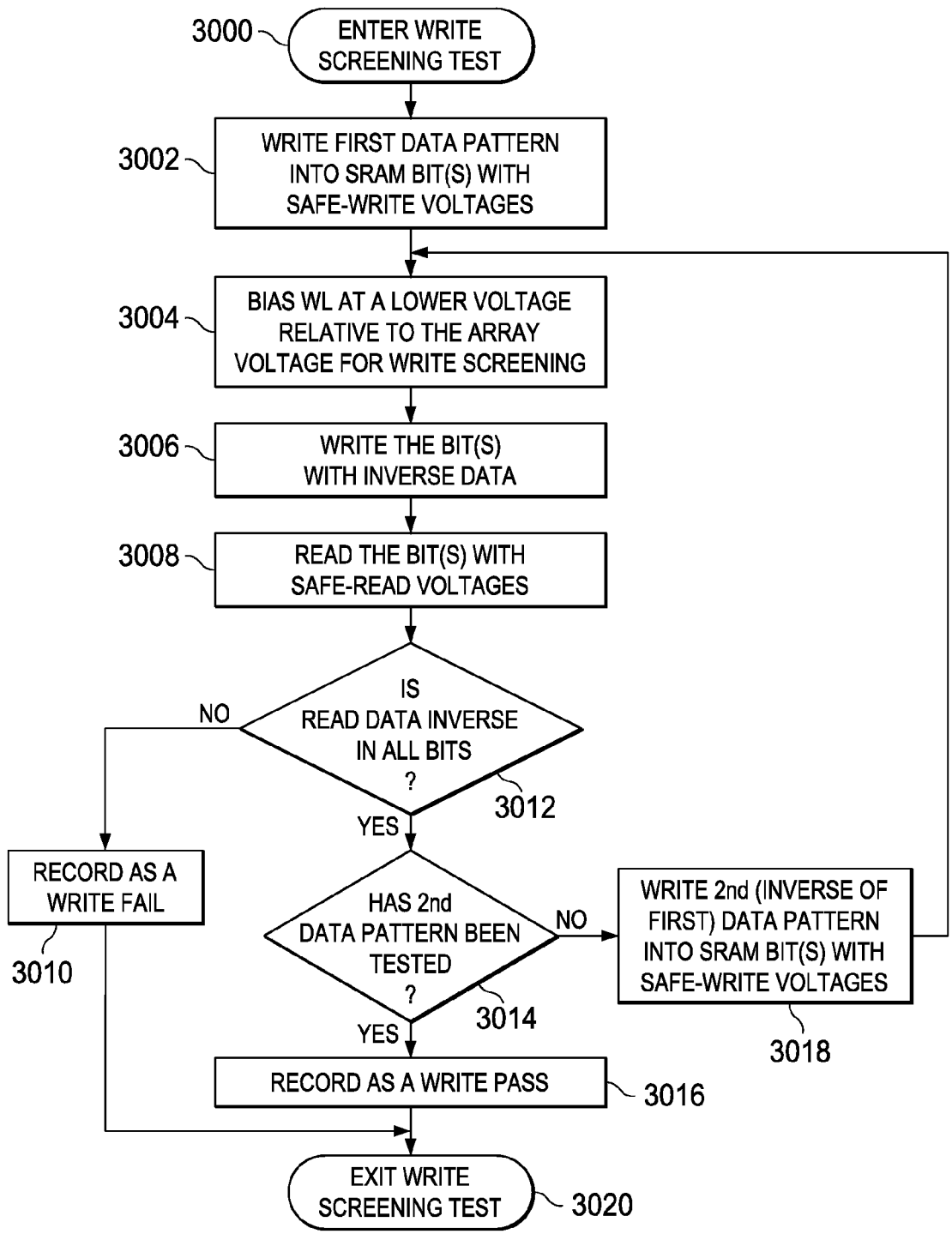
FIGS. 3A, 3B, and 3C are flow charts of screening test embodiments.

FIG. 3A is a flow diagram illustrating an embodiment of a write screening test. In this test the WLV is lower than Vdda during a write portion of the screening test (3006). The screening test starts when a signal is sent to the BIST (2002) to switch the integrated circuit into the write screening mode, step (3000). A first data pattern is then written into each SRAM bit (1000) in the SRAM array (2030) using a safe-write voltage, step (3002). In step (3004), the wordline voltage, WLV, is lowered with respect to the array voltage, Vdda, and the inverse of each data value in the first pattern is written into each bit of the SRAM array in step (3006). The data value in each bit is then read in step (3008) using a safe-read voltage and checked (3012) to see if the inverse data value was successfully written. If the inverse data value was not written successfully to any one of the bits, a fail is recorded (3010) and the screening test may be exited (3020) or the screening test may continue until the total number of bits that fail exceeds the predetermined repairable limit. If, however, the inverse data value was written successfully to every bit of the SRAM array, the circuit then checks to determine if a second data pattern has been tested (3014). If not, a second data pattern which is the inverse of the first data pattern is written into the SRAM array (3018) and the test is repeated. When it is determined in step (3014) that the second data pattern has been tested, a write pass is recorded (3016) and the write screening test is exited (3020).

Figure 3B:
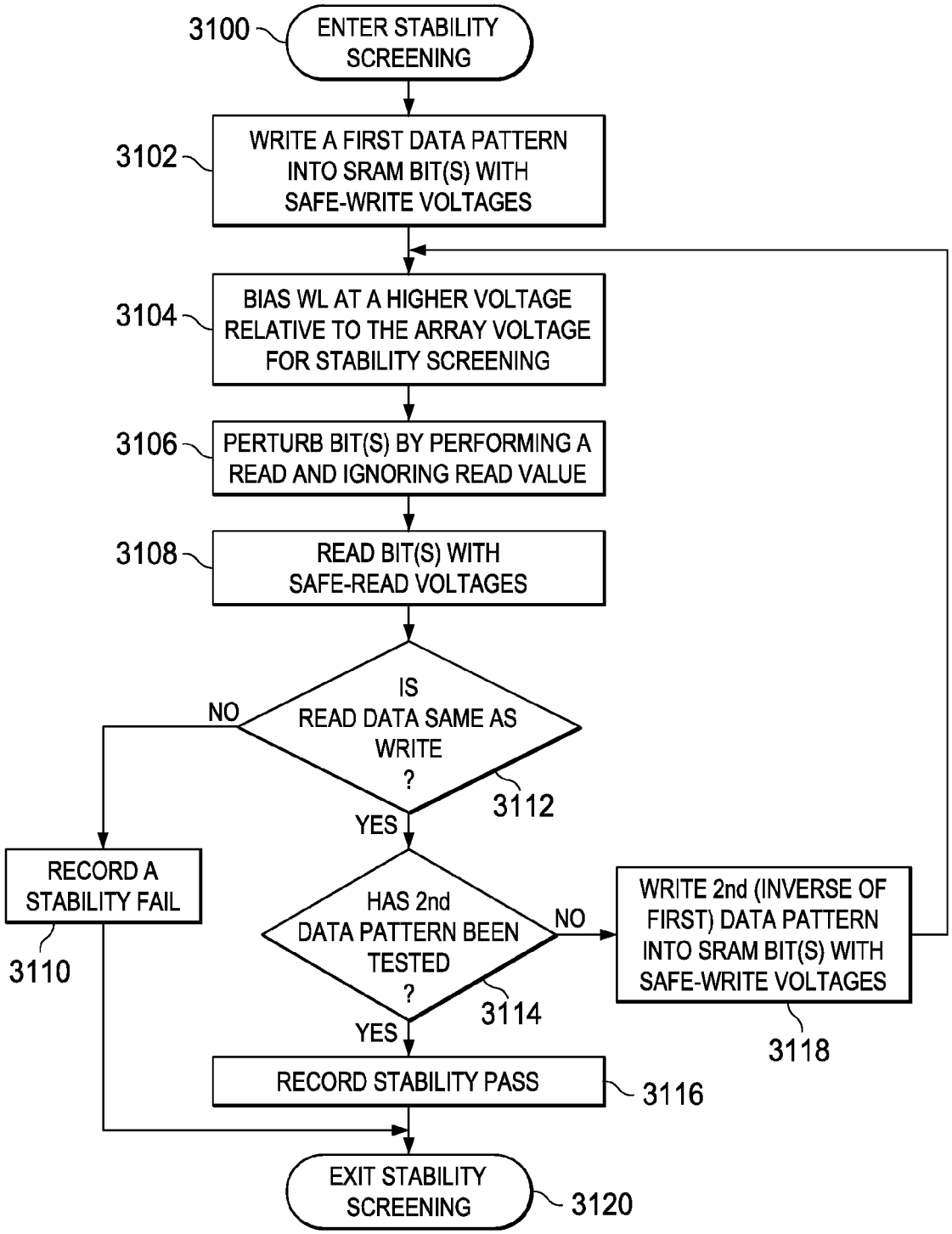

FIG. 3B is a flow diagram illustrating an embodiment of a stability screening test. In this test the WLV is higher than Vdda during one portion of the screening test, steps (3104) and (3106), to evaluate the stability margin. The stability screening test starts when a signal is sent to the integrated circuit to switch the BIST (2002) into the stability screen testing mode step (3 100). A first data pattern is written into each of the SRAM bits (1000) in the SRAM array (2030) using a safe-write voltage, step (3102). In step (3104), WLV may be raised and/or Vdda may be lowered so that the voltage on the WL is higher than the array voltage, Vdda. A stress read operation is then performed in step (3106) to test the stability of the data in an SRAM bit. In weak SRAM bits, this read operation may disturb the data value causing the SRAM to flip to the inverse state. In step (3108) the SRAM bit is read using a safe-read voltage and checked (3112) to see if the previous data stress operation (3106) caused the data value to flip to an inverse data value or not. If the data in the bit in the SRAM array that was read using a safe-read voltage (3108) is the same as the data that was written using the safe write voltage (3102), the stability screening test proceeds to step (3114). If, however, the read data value (3108) is different, then the bit fails the stability screening test, a fail is recorded (3110) and then the test may be stopped (3120) or the test may continue until a predetermined number of failed bits (that exceed the repair limit) is reached. If each bit in the SRAM array passes the stability screen test, a check is performed (3114) to see if a second data pattern has been tested. If the second data pattern has not been tested, the second data pattern, which is the inverse of the first data pattern, is written into the SRAM array (3118) and stability testing is repeated. When it is determined in step (3114) that the second data pattern has been tested, a stability screening pass is recorded (3116) and the stability screening test is exited (3120).

Figure 3C:
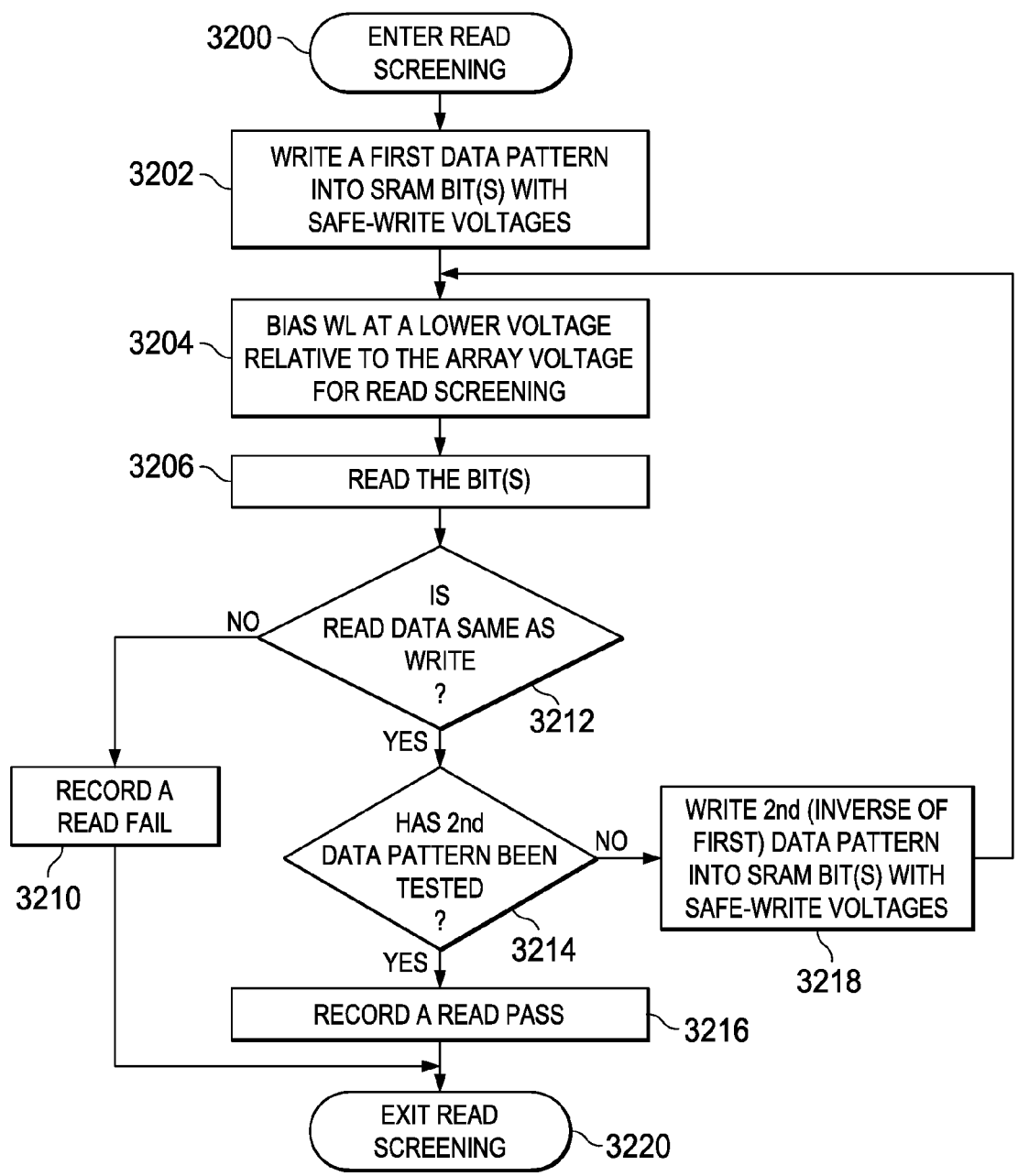

FIG. 3C is a flow diagram illustrating an embodiment of a read screening test. In this test the WLV is lower than Vdda during one portion of the screening test, steps (3204) and (3206), to evaluate read margin. The read screening test starts when a signal is sent to the integrated circuit to switch the BIST (2002) into the stability screen testing mode step (3200). A first data pattern is written into each SRAM bit (1000) in the SRAM array (2030) using a safe-write voltage, step (3202). In step (3204), WLV may be lowered and/or Vdda may be raised so that WLV is lower than the array voltage, Vdda. A read operation is then performed in step (3206) and the read data is checked (3212) to determine if the data in a SRAM bit may be read correctly with the lowered WLV. If the data in the SRAM bit read using a lowered WLV voltage (3206) is the same as the data that was written using the safe write voltage (3202), the read screening test proceeds to step (3214). If, however, the read data value (3206) in the bit is different, the bit fails the read screening test, and a fail is recorded (3210) and then the test may be stopped (3220) or the test may continue until a predetermined number of failed bits that exceeds the repair limit is reached. If all bits pass the read screening test, a check is performed (3214) to see if a second data pattern has been tested. If the second data pattern has not been tested, a second data pattern which is the inverse of the first data pattern is written into the bits in the SRAM array (3218) and the read test is repeated. When it is determined in step (3214) that the second data pattern has been tested, a read pass is recorded (3216) and the read screening test is exited (3220).

In the screening tests used for illustration, each bit is tested with a first pattern and also with a second pattern. If a bit fails a first pattern during the screening test, the testing of the second pattern may be abandoned to reduce testing time. In addition, in the screening tests used for illustration, all of the bits are tested with a first data pattern before conducting the test with the second data pattern which is the inverse of the first data pattern. However, in practice, one bit may be tested with the first data pattern and then tested with the second data pattern before testing the next bit in the SRAM array.

Figure 4:
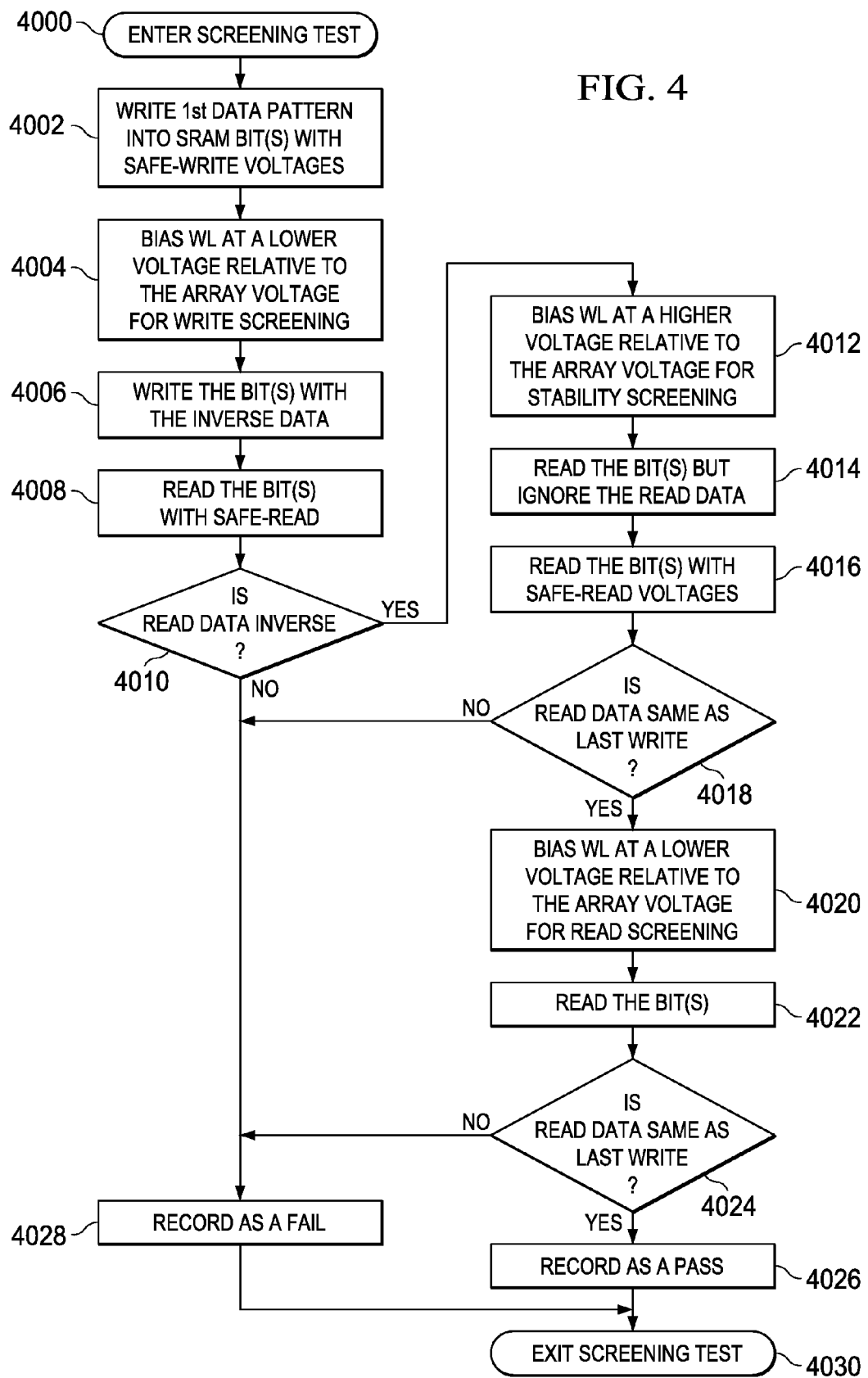
FIG. 4 is an integrated screening test flow.
Figure 5:
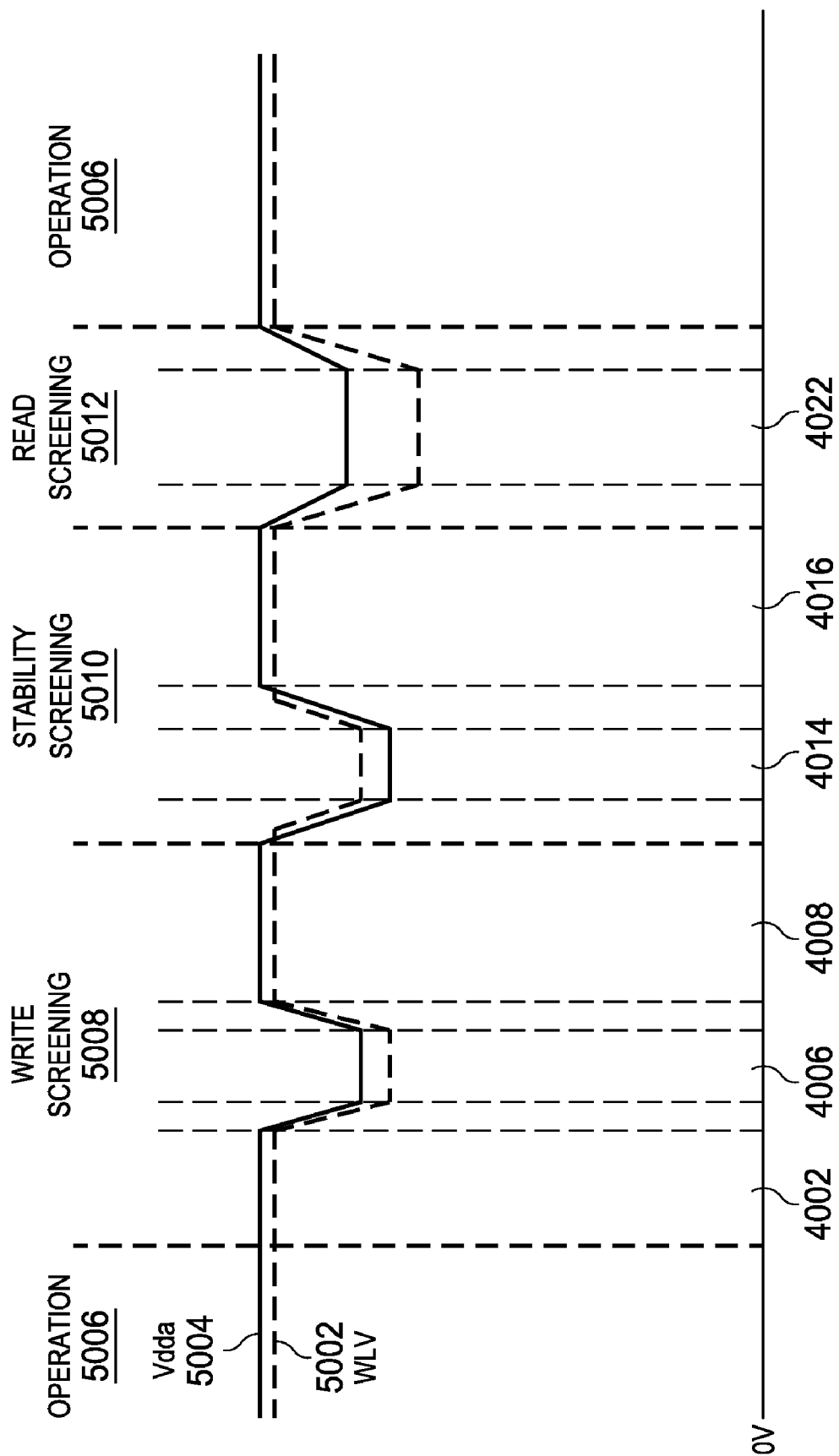
FIG. 5 is a timing diagram of the voltage levels, Vdda and WLV during an example screening test.

FIGS. 4 and 5 illustrate a screening procedure in which write, stability, and read screens are integrated together into a one pass screening test. FIG. 4 is a flow diagram illustrating the integrated procedure and FIG. 5 is a voltage diagram of Vdda (5004) and WLV (5002) during operation (5006), during the write screening test (5008), during the stability screening test (5010) and during the read screening test (5012). Numbers which correspond to the steps in the flow diagram of FIG. 4 are indicated below the horizontal time axis in FIG. 5. In FIG. 5 WLV (5002) is shown to have a fixed offset below Vdda (5004) during operation but these two voltages may also be equal during operation.

In FIG. 4 a signal is sent to the integrated circuit to switch it from an operational mode into a screening test mode in step (4000). A first data pattern is then written into the SRAM array with safe-write voltages in step (4002). In step (4004) the wordline voltage is then lowered relative to the array voltage and the inverse data pattern is written into the SRAM array in step (4006). The inverse data is then read using safe-read voltages (4008) and checked (4010) to see if the inverse data was successfully written into the SRAM bit. If a write screen error is found then the bit fails and the test may be terminated (4030) after recording a test fail (4028). The test may also continue until a number of failed bits which exceed the repair limit are detected. If, however, every bit in the array passes the write screen, the wordline voltage is biased higher than the array voltage (or the array voltage is biased lower than the wordline voltage) in step (4012) and a read operation is performed on each bit in step (4014). The purpose of this read operation is to determine if the data in an SRAM bit is stable when undergoing a read operation or if the read operation disturbs the data and causes the data in the bit to change. In step (4016) the data in each bit is read using safe-read voltages to see if the data in any of the SRAM bits was disturbed by the previous read in step (4014). If the data in any of the bits was disturbed (changed), a fail is recorded for the failed bit(s) and the screening test may be terminated (4030) after recording a test fail (4028) or may continue until the repair limit is exceeded. If, however, all the bits pass the stability screen test (4018), the screening test proceeds to step (4020) where the wordline voltage is lowered relative to the array voltage and the data in each bit is again read (4022). The data for each bit is checked (4024) to determine if the data was read correctly. If the data read in any of the bits fails to read correctly a fail is recorded (4028) for the failed bit(s) and the screening test may be terminated (4030) or screening may continue until the repair limit is exceeded. If, however, all the SRAM bits in the array are read correctly the integrated circuit passes (4026) the first data pattern test.

The next step (not shown) may be to write a $2^{nd}$ pattern into the SRAM array where the $2^{nd}$ data pattern is the inverse of the $1^{st}$ data pattern and to repeat the screening test starting with step (4004). If all the bits in the SRAM array pass each of the tests in the screening sequence then the integrated circuit passes and the screening test is exited (4030). Also, instead of screening all bits in the array with the first pattern before screening all bits in the array with the second pattern, each bit may be screened with the first pattern and then with the second pattern before screening the next bit. In addition, as soon as a bit fails a screen test it may be excluded from all subsequent testing to reduce the total testing time.

To illustrate the screening procedure above, a write screen was performed followed by a stability screen and then a read screen, but these screens may be performed in other orders as well. For example, the screening test with the highest failure rate may be performed first to reduce screen testing time. As mentioned previously, the signals and voltages for the screens may be generated by on chip voltage generators and an on chip test controller or they may be supplied to the circuit through pins from off chip power supplies and an off chip screening test controller. During a portion of the screening tests the operation transistor (2020) in FIG. 2 is turned off to disconnect Vdda and WLV so that different voltages may be applied to the SRAM wordlines versus the SRAM array. During the remaining portion of the screening tests, the operation transistor (2020) may be turned on so that WLV is equal to Vdda.

During the operation of the integrated circuit, the operation transistor (2020) may be turned on so that WLV is equal to VDDA. Optionally it may be advantageous to establish a fixed delta between the WLV and Vdda voltage levels during integrated circuit operation. In this case the operation transistor (2020) may remain turned off during the operation of the integrated circuit. Moreover, if the operation transistor (2020) in FIG. 2 is turned off to disconnect Vdda and WLV so that different voltages may be applied to the SRAM wordlines versus the SRAM array, then a power savings during the operation of the integrated circuit may be realized by removing power from the wordline drivers (2012) of unaccessed arrays (2032) while concurrently supplying power to Vdda for retention of data.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An SRAM circuit, comprising:
an SRAM array:
an array voltage supply coupled to said SRAM array which supplies a first array voltage to said SRAM array during operation of said SRAM circuit and supplies a second array voltage to said SRAM array during screening of said SRAM array;
a BIST circuit coupled to said SRAM array;
a wordline driver voltage supply coupled to said SRAM array which supplies a wordline voltage to a wordline driver during screening of said SRAM array;
a first switch coupled to said SRAM array which couples said wordline driver voltage supply to said wordline driver; and
a second switch coupled to said SRAM array which couples said wordline driver to said array voltage supply.

2. The integrated circuit of claim 1 wherein said SRAM circuit is embedded within an integrated circuit.

3. The integrated circuit of claim 2 wherein said wordline driver voltage supply is external to said integrated circuit and supplied to said integrated circuit through a pin.

4. The integrated circuit of claim 1 further comprising a voltage level changing device coupled to said second switch and coupled between said wordline and said array voltage supply.

5. A system, comprising:
an SRAM circuit containing an SRAM array;
a screening test controller coupled to said SRAM array;
an array voltage supply coupled to said SRAM array which supplies a first array voltage to an SRAM array within said SRAM circuit during operation of said SRAM circuit, and supplies a second set of array voltages to said SRAM array during screening of said SRAM array;

a wordline driver voltage supply coupled to said SRAM array which supplies a wordline voltage to a wordline driver during screening of said SRAM array;

a first switch which couples said wordline driver voltage supply to said wordline driver during screening and decouples said wordline driver voltage supply from said wordline driver during operation; and a second switch which couples said wordline driver to said array voltage supply during operation of said SRAM circuit and decouples said wordline driver from said array voltage supply during screening.

6. The system of claim 5 wherein said screening test controller is external to said SRAM circuit.

7. The system of claim 5 wherein said wordline driver voltage supply is external to said SRAM circuit.

8. The system of claim 5 further comprising a voltage level changing device coupled to said second switch and coupled between said wordline driver and said array voltage.

9. The system of claim 5 wherein said SRAM circuit is embedded within an integrated circuit.

10. A method for operating and screening an SRAM circuit containing an SRAM array, comprising;

applying a signal to switch said SRAM circuit into a screening mode;

turning off a first transistor to disconnect a wordline driver from an SRAM array voltage power supply;

turning on a second transistor to connect said wordline driver to a wordline driver power supply;

applying an array voltage to said SRAM array;

applying a wordline voltage to said wordline driver;

writing a first data pattern into SRAM bits in said SRAM circuit;

performing a first screening test on at least one of said SRAM bits, wherein said wordline voltage is different than said array voltage during a first portion of said first screening test;

writing an inverse of said first data pattern into at least one of said SRAM bits;

performing a second screening test on at least one of said SRAM bits, wherein said wordline voltage is different than said array voltage during a second portion of said second screening test;

applying a signal to switch said SRAM circuit into an operational mode;

turning off said second transistor to disconnect said wordline driver from said wordline driver power supply; and turning on said first transistor to connect said wordline driver to said SRAM array voltage power supply.

11. The method of claim 10 wherein said first screening test is a write screening test and wherein said first portion of said first screening test is a write operation wherein said wordline voltage is lower than said array voltage.

12. The method of claim 10 wherein said second screening test is a write screening test and wherein said second portion of said second screening test is a write operation wherein said wordline voltage is lower than said array voltage.

13. The method of claim 10 wherein said first screening test is a stability screening test and wherein said first portion of said first screening test is a data disturb read operation wherein said array voltage is lower than said wordline voltage.

14. The method of claim 10 wherein said second screening test is a stability screening test and wherein said second portion of said second screening test is a data disturb read operation wherein said array voltage is lower than said wordline voltage.

15. The method of claim 10 wherein said first screening test is a read screening test and wherein said first portion of said first screening test is a read operation wherein said wordline voltage is lower than said array voltage.

16. The method of claim 10 wherein said second screening test is a read screening test and wherein said second portion of said second screening test is a read operation wherein said wordline voltage is lower than said array voltage.

17. The method of claim 10 wherein said wordline voltage and said array voltage are the same during operation of said integrated circuit.

18. The method of claim 10 wherein there is a fixed delta voltage between said wordline voltage and said array voltage during operation of said integrated circuit.

19. The method of claim 18 wherein said array voltage is higher than said wordline voltage.

20. The integrated circuit of claim 10 wherein said SRAM circuit is embedded within an integrated circuit.

\* \* \* \* \*